(12) United States Patent
Lin

(10) Patent No.: US 8,853,554 B2
(45) Date of Patent: Oct. 7, 2014

(54) TOUCH MODULE WITH PHOTOVOLTAIC CONVERSION FUNCTION

(71) Applicant: Chih-Chung Lin, Taipei (TW)

(72) Inventor: Chih-Chung Lin, Taipei (TW)

(73) Assignee: Chih-Chung Lin, Taipei (TW)

( * ) Notice: Subject to any disclaimer, the term of this patent is extended or adjusted under 35 U.S.C. 154(b) by 98 days.

(21) Appl. No.: 13/726,189

(22) Filed: Dec. 23, 2012

(65) Prior Publication Data

US 2014/0126122 A1 May 8, 2014

(30) Foreign Application Priority Data

Nov. 7, 2012 (TW) .............................. 101141310 A

(51) Int. Cl.
*H05K 1/03* (2006.01)
*H05K 7/00* (2006.01)
*H01L 31/04* (2014.01)

(52) U.S. Cl.
CPC ............... *H05K 7/005* (2013.01); *H01L 31/04* (2013.01)
USPC ........... 174/255; 345/168; 345/173; 345/175; 702/64; 349/116

(58) Field of Classification Search
CPC ........... G06F 3/02; G06F 3/033; G06F 3/042; G06F 3/0421; G06F 3/0202; G06F 3/0231; G06F 3/04886; G06F 19/00; H01L 27/14609; H01L 31/1055; H01L 31/02242

USPC ............ 174/255; 345/168, 173, 175; 702/64; 349/116

See application file for complete search history.

(56) References Cited

U.S. PATENT DOCUMENTS

| | | | |
|---|---|---|---|
| 4,567,480 A * | 1/1986 | Blanchard | 345/175 |
| 8,199,114 B1 * | 6/2012 | Jaeger et al. | 345/173 |
| 2007/0057793 A1 * | 3/2007 | Alden | 340/572.1 |
| 2008/0238879 A1 * | 10/2008 | Jaeger et al. | 345/173 |
| 2010/0134735 A1 * | 6/2010 | Nakamura et al. | 349/116 |
| 2011/0298718 A1 * | 12/2011 | Chang et al. | 345/168 |
| 2012/0105370 A1 * | 5/2012 | Moore | 345/174 |
| 2012/0160560 A1 * | 6/2012 | Kajiya et al. | 174/70 R |
| 2013/0021300 A1 * | 1/2013 | Wassvik | 345/175 |
| 2013/0050147 A1 * | 2/2013 | Tseng et al. | 345/175 |
| 2013/0165653 A1 * | 6/2013 | Inoue et al. | 544/225 |

* cited by examiner

*Primary Examiner* — Xiaoliang Chen

(57) ABSTRACT

A touch module with photovoltaic conversion function includes a touch zone and a non-touch zone. The touch zone includes a first clear substrate, a second clear substrate and a photovoltaic conversion unit. The first clear substrate has opposite first and second sides, and the second clear substrate has opposite third and fourth sides. A first and a second touch electrode layer are provided on the second side and the third side, respectively; and the photovoltaic conversion unit is provided on the first side of the first clear substrate. By providing the photovoltaic conversion unit in the touch zone of the touch module, the photovoltaic conversion unit can have increased light-absorption areas to enable conversion of light into more electric current and accordingly, enable a touch device using the touch module to have extended standby and operation time.

10 Claims, 2 Drawing Sheets

TOUCH MODULE WITH PHOTOVOLTAIC CONVERSION FUNCTION

This application claims the priority benefit of Taiwan patent application number 101141310 filed on Nov. 7, 2012.

FIELD OF THE INVENTION

The present invention relates to a touch module with photovoltaic conversion function, and more particularly to a touch module that includes a photovoltaic conversion unit provided in a touch zone thereof, so that the photovoltaic conversion unit can have increased light-absorption areas to enable conversion of light into more electric current and accordingly, enable a touch device using the touch module to have extended standby and operation time.

BACKGROUND OF THE INVENTION

Power supply plays a very important role in the length of standby and operation time of a general portable electronic device. The currently available portable electronic devices rely on the electric power supplied by their built-in battery to maintain operation thereof. For a portable electronic device that includes a touch device, more power will be consumed during its operation to thereby largely shorten the length of standby and operation time thereof.

One of the ways for solving the problem of large power consumption of the conventional portable electronic device is to combine a solar module with the portable electronic device. The solar module enables photovoltaic conversion and stores the converted electric energy in the built-in battery of the portable electronic device, so that the portable electronic device can have extended standby and operation time. The solar module is mainly arranged in a non-touch zone or a housing of the portable electronic device. For the solar module to absorb light irradiated thereon and convert the absorbed light into electric current, the portable electronic device must have a clear housing or allow the solar module to expose from the housing. As a result, the portable electronic device would disadvantageously have a large overall thickness.

SUMMARY OF THE INVENTION

To overcome the drawbacks of the conventional solar module for portable electronic device, it is a primary object of the present invention to provide a touch module with photovoltaic conversion function that includes a photovoltaic conversion unit provided in a touch zone thereof, so that the photovoltaic conversion unit can have increased light-absorption areas to enable conversion of light into more electric current and accordingly, enable a touch device using the touch module to have extended standby and operation time.

To achieve the above and other objects, the touch module with photovoltaic conversion function according to the present invention includes a touch zone and a non-touch zone. The touch zone includes a first clear substrate, a second clear substrate, and a photovoltaic conversion unit. The first clear substrate has a first side and an opposite second side; and the second clear substrate has a third side and an opposite fourth side. A first touch electrode layer and a second touch electrode layer are provided on the second side and the third side, respectively, in the touch zone, and the photovoltaic conversion unit is located on the first side of the first clear substrate. The non-touch zone is located immediately around the touch zone and includes a first electrode trace layer and a second electrode trace layer electrically connected to the first and the second touch electrode layer, respectively. By providing the photovoltaic conversion unit in the touch zone of the touch module, the photovoltaic conversion unit can have increased light-absorption areas to enable conversion of light into more electric current and accordingly, enable a touch device using the touch module to have extended standby and operation time. Moreover, with the photovoltaic conversion unit being provided in the touch zone, the touch module can have a reduced overall thickness and it is not necessary to provide a touch device with a clear housing for the purpose of absorbing light to achieve photovoltaic conversion.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with a preferred embodiment thereof and with reference to the accompanying drawings.

Figure 1:
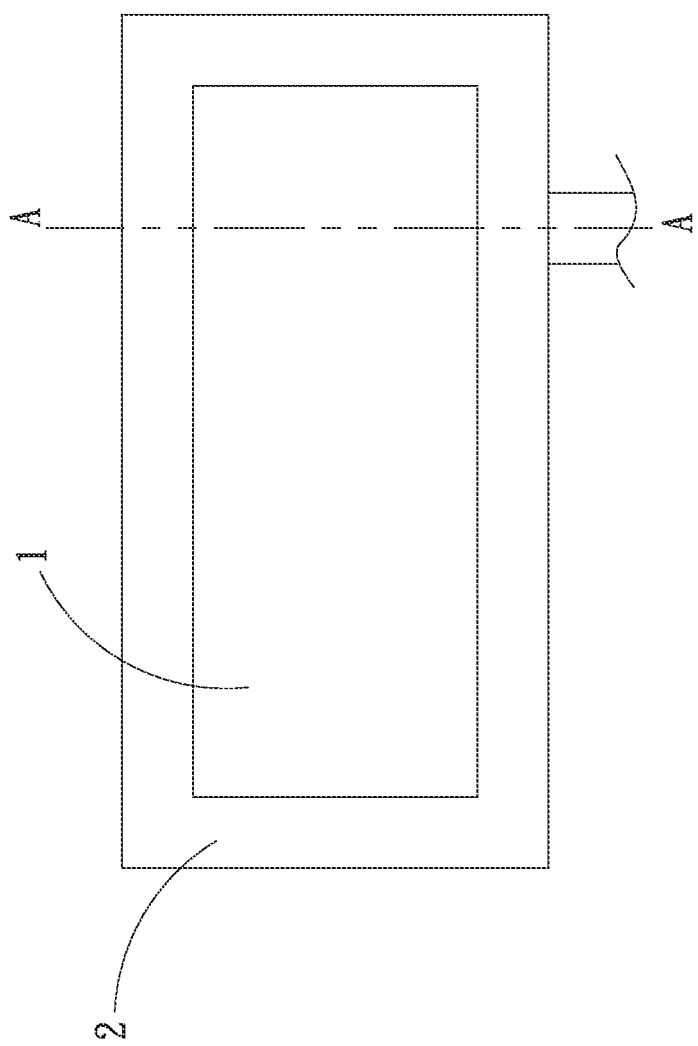
FIG. 1 is an assembled plan view of a touch module with photovoltaic conversion function according to a preferred embodiment of the present invention.
Figure 2:
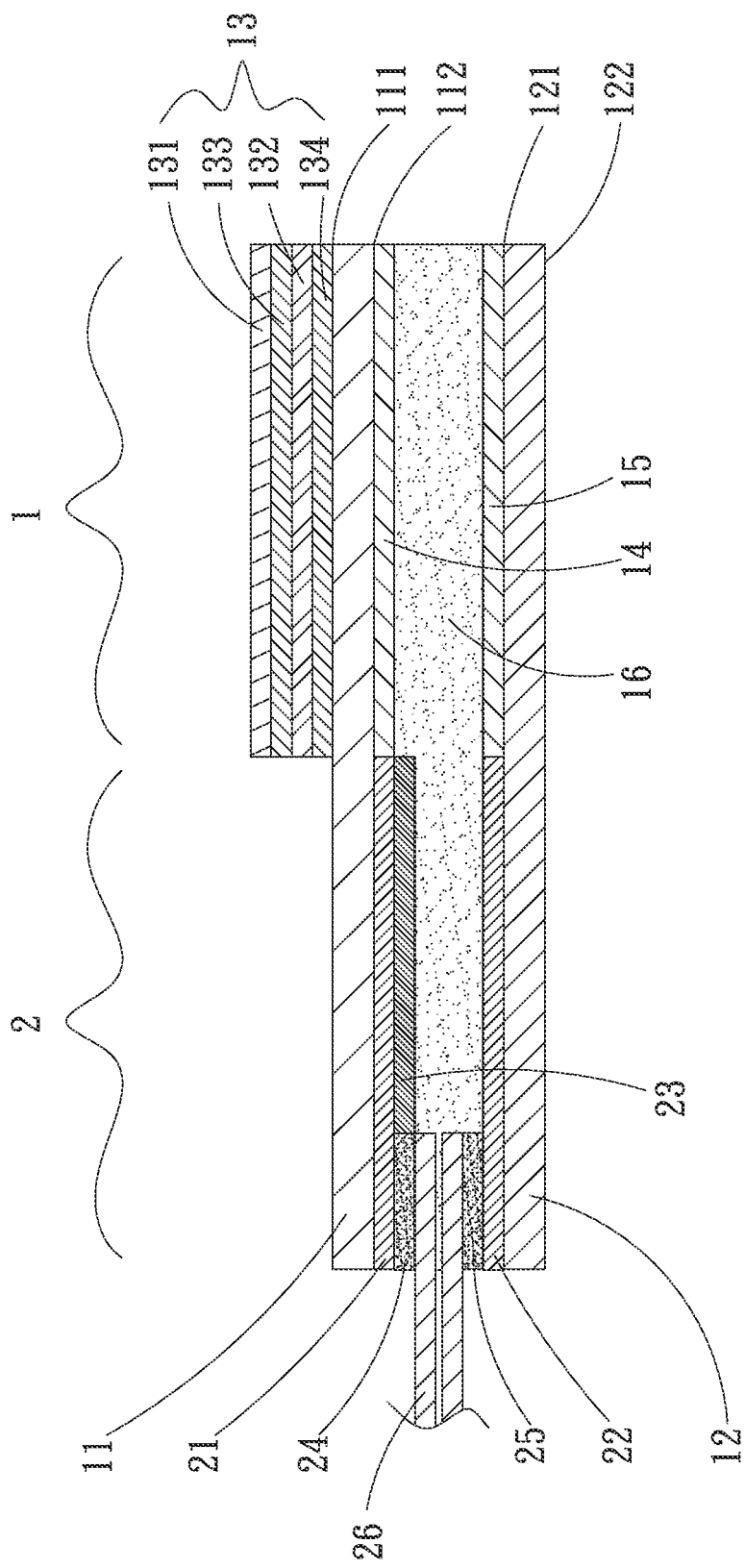
FIG. 2 is a sectional view taken along line A-A of FIG. 1.

Please refer to FIG. 1 that is an assembled plan view of a touch module with photovoltaic conversion function according to a preferred embodiment of the present invention and to FIG. 2 that is a sectional view taken along line A-A of FIG. 1. As shown, the touch module of the present invention includes a touch zone 1 and a non-touch zone 2.

The touch zone 1 includes a first clear substrate 11, a second clear substrate 12, and a photovoltaic conversion unit 13. In the illustrated preferred embodiment, the first and the second clear substrate 11, 12 are made of a glass material and a plastic material, respectively. However, in practical implementation of the present invention, the first and the second clear substrate 11, 12 can also be respectively made of other materials, such as polyethylene terephthalate (PET), polycarbonate (PC), polyethylene (PE), polyvinylchloride (PVC), polypropylene (PP), polystyrene (PS), polymethylmethacrylate (PMMA), or cyclo olefin copolymer (COC).

The first clear substrate 11 has a first side 111 and an opposite second side 112; and the second clear substrate 12 has a third side 121 and an opposite fourth side 122. A first touch electrode layer 14 and a second touch electrode layer 15 are provided on the second side 112 and the third side 121, respectively, in the touch zone 1. Here, the first and the second touch electrode layer 14, 15 may be an indium tin oxide (ITO) film, an antimony tin oxide (ATO) film, or an indium zinc oxide (IZO) film. In the illustrated preferred embodiment, the first and the second touch electrode layer 14, 15 are respectively formed on the second side 112 and the third side 121 by way of sputtering deposition. However, it is understood, in practical implementation of the present invention, the first and the second touch electrode layer 14, 15 can be otherwise formed on the second and the third side 112, 121, respectively, by way of applying a gel layer, electrical plating or vapor deposition.

The touch zone 1 further includes an adhesive layer 16 provided between the first and the second clear substrate 11, 12. More specifically, in the illustrated preferred embodiment, the adhesive layer 16 is provided between the first and the second touch electrode layer 14, 15, and may be a layer of optical clear resin or a layer of optical clear adhesive.

The photovoltaic conversion unit 13 is provided on the first side 111 of the first clear substrate 11, and includes an anti-reflective layer 131 and a light-absorption layer 132. A first and a second clear electrode layer 133, 134 are provided on two opposite sides of the light-absorption layer 132, respectively. The anti-reflective layer 131 is located on one side of the first clear electrode layer 133 opposite to the light-absorption layer 132. In the illustrated preferred embodiment, the photovoltaic conversion unit 13 is a thin-film solar cell.

The non-touch zone 2 is located immediately around the touch zone 1, and includes a first and a second electrode trace layer 21, 22 electrically connected to the first and the second touch electrode layer 14, 15, respectively. The first clear substrate 11, the second clear substrate 12 and the adhesive layer 16 of the touch zone 1 are extended into the non-touch zone 2, such that the first electrode trace layer 21 is located below the second side 112 of the first clear substrate 11 and the second electrode trace layer 22 is located on the third side 121 of the second clear substrate 12.

The non-touch zone 2 further includes a shielding layer 23, a first conductive adhesive layer 24, a second conductive adhesive layer 25, and a flexible circuit board 26. The shielding layer 23 is located on one side of the first electrode trace layer 21 opposite to the first clear substrate 11, and the adhesive layer 16 of the touch zone 1 is extended into the non-touch zone 2 to locate between the shielding layer 23 and the second electrode trace layer 22. The first conductive adhesive layer 24 is located on one side of the first electrode trace layer 21 opposite to the first clear substrate 11 to connect with the shielding layer 23. The second conductive adhesive layer 25 is located on one side of the second electrode trace layer 22 opposite to the second clear substrate 12. The flexible circuit board 26 is located between the first and the second conductive adhesive layer 24, 25. By providing the photovoltaic conversion unit 13 in the touch zone 1 of the touch module, the photovoltaic conversion unit 13 can have increased light-absorption areas to enable conversion of light into more electric current and accordingly, enable a touch device using the touch module to have extended standby and operation time. Moreover, with the photovoltaic conversion unit 13 being provided in the touch zone 1, the touch module can have a reduced overall thickness and it is not necessary to provide the touch device with a clear housing for the purpose of absorbing light to achieve photovoltaic conversion.

In brief, the touch module with photovoltaic conversion function according to the present invention is superior to the prior art due to the following advantages: (1) providing increased light-absorption areas; (2) enabling conversion of light into more electric current; and (3) extending the standby and operation time of a touch device.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A touch module with photovoltaic conversion function, comprising:

a touch zone including a first clear substrate, a second clear substrate, and a photovoltaic conversion unit; the first clear substrate having a first side and an opposite second side, and the second clear substrate having a third side and an opposite fourth side; a first touch electrode layer and a second touch electrode layer being provided on the second and the third side, respectively; and the photovoltaic conversion unit being provided on the first side of the first clear substrate; and a non-touch zone being located immediately around the touch zone, and including a first and a second electrode trace layer electrically connected to the first and the second touch electrode layer, respectively.

2. The touch module with photovoltaic conversion function as claimed in claim 1, wherein the touch zone further includes an adhesive layer provided between the first and the second clear substrate, and the adhesive layer being selected from the group consisting of an optical clear resin layer and an optical clear adhesive layer.

3. The touch module with photovoltaic conversion function as claimed in claim 1, wherein the photovoltaic conversion layer includes an anti-reflective layer and a light-absorption layer; the light-absorption layer being provided on two opposite sides with a first and a second clear electrode layer, respectively; and the anti-reflective layer being located on one side of the first clear electrode layer opposite to the light-absorption layer.

4. The touch module with photovoltaic conversion function as claimed in claim 1, wherein the first and the second clear substrate are extended into the non-touch zone; the first electrode trace layer being located below the second side of the first clear substrate, and the second electrode trace layer being located on the third side of the second clear substrate.

5. The touch module with photovoltaic conversion function as claimed in claim 4, wherein the non-touch zone further includes a shielding layer provided on one side of the first electrode trace layer opposite to the first clear substrate.

6. The touch module with photovoltaic conversion function as claimed in claim 4, wherein the non-touch zone further includes a first conductive adhesive layer, a second conductive adhesive layer, and a flexible circuit board; the first conductive adhesive layer being located on one side of the first electrode trace layer opposite to the first clear substrate, the second conductive adhesive layer being located on one side of the second electrode trace layer opposite to the second clear substrate, and the flexible circuit board being located between the first and the second conductive adhesive layer.

7. The touch module with photovoltaic conversion function as claimed in claim 1, wherein the photovoltaic conversion unit is a thin-film solar cell.

8. The touch module with photovoltaic conversion function as claimed in claim 1, wherein the first and the second clear substrate are respectively made of a material selected from the group consisting of polyethylene terephthalate (PET), polycarbonate (PC), polyethylene (PE), polyvinylchloride (PVC), polypropylene (PP), polystyrene (PS), polymethylmethacrylate (PMMA), cyclo olefin copolymer (COC), glass and plastics.

9. The touch module with photovoltaic conversion function as claimed in claim 1, wherein the first and the second touch electrode layer are respectively a thin-film structure formed by a manner selected from the group consisting of applying a gel layer, electrical plating, vapor deposition and sputtering deposition; and the thin-film structure being selected from the group consisting of an indium tin oxide (ITO) film, an antimony tin oxide (ATO) film, and an indium zinc oxide (IZO) film.

10. The touch module with photovoltaic conversion function as claimed in claim 4, wherein the adhesive layer is extended into the non-touch zone and located between the first and the second electrode trace layer.

* * * * *